US006720892B1

(12) United States Patent
Lachor

(10) Patent No.: US 6,720,892 B1
(45) Date of Patent: Apr. 13, 2004

(54) ELECTRONIC KEYBOARD WITH LUMINOUS KEYS

(75) Inventor: Wladyslas Lachor, Lagny le Sec (FR)

(73) Assignee: Thomson-CSF Sextant, Velizy Villacoublay (FR)

( * ) Notice: Subject to any disclaimer, the term of this patent is extended or adjusted under 35 U.S.C. 154(b) by 0 days.

(21) Appl. No.: 09/856,184

(22) PCT Filed: Dec. 7, 1999

(86) PCT No.: PCT/FR99/03037

§ 371 (c)(1), (2), (4) Date: Jun. 6, 2001

(87) PCT Pub. No.: WO00/34968

PCT Pub. Date: Jun. 15, 2000

(30) Foreign Application Priority Data

Dec. 8, 1998 (FR) .......................................... 98 15479

(51) Int. Cl.[7] .............................................. H03M 11/00

(52) U.S. Cl. ......................... 341/22; 200/310; 200/314; 345/170; 341/23

(58) Field of Search ............................. 341/20, 22, 23; 345/170; 400/487; 200/310, 311, 313, 314; 361/749

(56) References Cited

U.S. PATENT DOCUMENTS

| | | | | |
|---|---|---|---|---|
| 4,956,528 A | * | 9/1990 | Janniere et al. | 200/314 |
| 5,234,744 A | * | 8/1993 | Kenmochi | 428/195.1 |
| 5,818,361 A | * | 10/1998 | Acevedo | 341/23 |
| 5,847,336 A | * | 12/1998 | Thornton | 200/5 A |
| 5,914,676 A | * | 6/1999 | Akpa | 341/23 |
| 5,960,942 A | * | 10/1999 | Thornton | 200/314 |
| 6,067,074 A | * | 5/2000 | Lueders | 345/156 |
| 6,310,308 B1 | * | 10/2001 | Watson et al. | 200/520 |

FOREIGN PATENT DOCUMENTS

| | | |
|---|---|---|
| DE | 36 30 898 | 4/1988 |
| GB | 2 195 206 | 3/1988 |

* cited by examiner

*Primary Examiner*—Albert K. Wong
(74) *Attorney, Agent, or Firm*—Oblon, Spivak, McClelland, Maier & Neustadt, P.C.

(57) ABSTRACT

An electronic keyboard, in particular one to be used in a dark environment and which therefore requires illumination of the keys. The keyboard includes a rigid printed circuit on which are soldered switches which can be actuated indirectly by the finger of the user, each switch being surmounted by an at least partially transparent key and an illumination device designed to illuminate the key from the rear of the key. A flexible printed circuit, carrying supply conductors for light-emitting diodes, is interposed between the keys and the rigid printed circuit carrying the switches. The flexible printed circuit includes a rigid part between a key and the corresponding switch, and the light-emitting diode which is to illuminate each key from the rear is soldered on the rigid part of the flexible printed circuit, between the key and the switch. The key preferably includes a cavity in which the diode will be housed. A key bears on the switch by way of the rigid part without bearing on the diode.

7 Claims, 1 Drawing Sheet

ELECTRONIC KEYBOARD WITH LUMINOUS KEYS

The invention relates to electronic keyboards which make it possible to provide an interface for inputting information or instructions into an electronic machine (computer or the like) controlled by a user.

The keys of the keyboard are either keys each representing an alphanumeric character, or keys each providing for the execution of a specified function.

In certain cases, one desires the keys to be illuminated so as to be more visible. This mainly involves cases where the user needs to work in a nocturnal environment. For example, aeronautical standards demand that certain keys, or even all the keys, of certain keyboards be illuminated at night. Specifically, night flying of aircraft or helicopters is carried out from an unilluminated cockpit, and it is necessary for the functionally important keys to be perfectly visible and identifiable without error by the pilot.

The keyboard is generally composed of a printed circuit on which components are soldered, and among these components there are pressure-actuatable mini-switches. These switches are each situated under a respective key of the keyboard, and the pressure of the finger on the key is transmitted to the switch to actuate it.

The illumination of the key by backlighting from the rear is hampered by the presence of the switch component under the key. To provide this illumination, one generally uses light-emitting diodes soldered on the printed circuit alongside the switch, but the quantity of light emitted often proves to be insufficient to meet the requirements.

The invention proposes a different keyboard structure allowing the best possible illumination of the keys from the rear.

The subject of the invention is an electronic keyboard comprising a rigid printed circuit on which is soldered at least one switch which can be actuated indirectly by the finger of a user, an at least partly transparent key surmounting the switch and a means of illumination designed to illuminate the key from underneath the latter, light rays emanating from the means of illumination being visible to the user via the transparent part of the key, characterized in that the keyboard furthermore comprises a flexible printed circuit interposed between the key and the rigid printed circuit carrying the switch, in that the flexible printed circuit comprises a rigid part situated between the key and the switch, in that the means of illumination comprises a light-emitting diode soldered on the rigid part between the key and the switch and in that the key comprises a cavity surrounded by a peripheral edge, the diode being housed in the cavity and the peripheral edge coming to bear on the rigid part around the diode.

The flexible printed circuit comprises conductors for conveying current to the light-emitting diode.

Preferably, the transparent key has a hollow shape at the rear, with a peripheral edge surrounding a cavity, the diode being housed in the cavity; the peripheral edge comes to bear on the rigid part of the flexible printed circuit, around the diode. It is therefore via the periphery of the cavity that the key can apply a pressure to the rigid part of the flexible printed circuit. This pressure is transmitted to the switch by this rigid part.

The flexible printed circuit can be used as return spring for the key so as to restore the key to its rest position in the absence of any pressure exerted by the finger of the user.

The flexible printed circuit can be linked electrically directly to the rigid printed circuit, or else both of them may be linked separately to the electronic apparatus (computer or the like) controlled via the keyboard.

Other characteristics and advantages of the invention will become apparent on reading the detailed description which follows and which is given with reference to the printed drawings in which.

Figure 1:
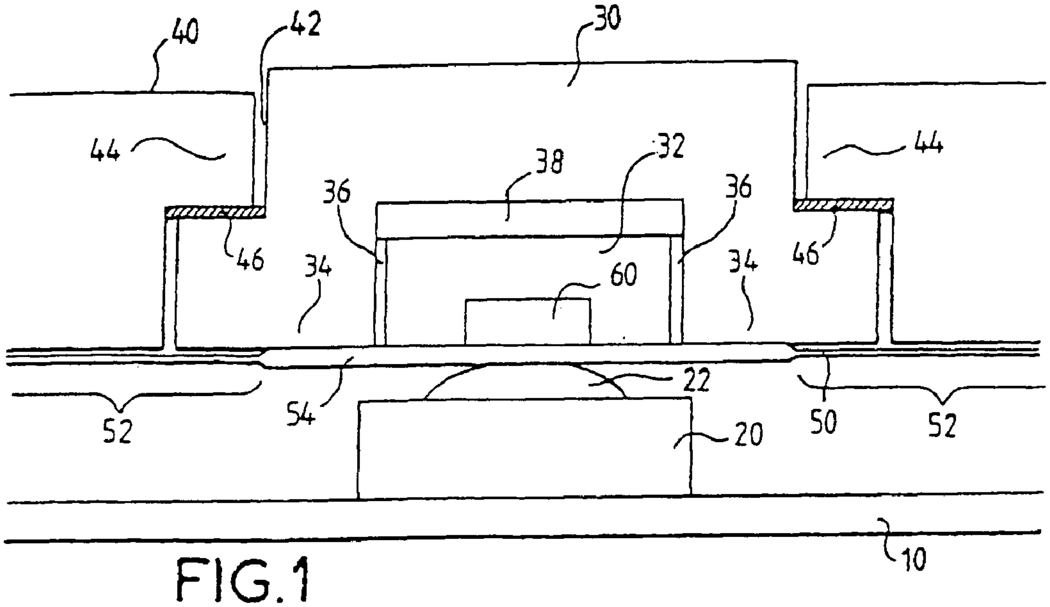
FIG. 1 represents a lateral sectional view of a portion of keyboard according to the invention, at the site of a key.

With reference firstly to FIG. 1, the keyboard comprises a rigid printed circuit 10 (thickness of around 2 millimeters for example) on which are arranged on the one hand mini-switches (20) each corresponding to a key of the keyboard, and on the other hand etched electrical conductors making it possible to link these switches to the outside of the keyboard so as to detect the open or closed state of the switches.

The etched conductors are not visible in the lateral section of FIG. 1.

The link between the keyboard and the outside, that is to say the link with the electronic apparatus controlled via the keyboard (computer or the like) is achieved for example by way of a connector arranged on the printed circuit, and via cables or flexible strips going from this connector to the apparatus. This link is conventional and need not be described here. Each switch is thus linked to the outside by printed conductors and by the connector, so that the state of the switch can be detected and the functionality desired for the key can be triggered when the depression thereof causes the switch to close (or exceptionally to open).

In FIG. 1, the switch 20 is a component soldered to the surface of the printed circuit 10. It comprises an internal mechanical contactor, not visible, linked to conductors of the printed circuit and actuated by depressing an elastic push 22 on the upper part of the component 20.

The key 30 of the keyboard, which serves as push button which can be manually actuated so as to activate a function, is at least partly transparent (for example made of organic glass) since it is desired to illuminate it via a light source placed at the rear (underneath the key in FIG. 1). This key is arranged exactly above the switch component 20 so that the depressing of the key causes the actuation of the switch. In the commonest case of actuation by direct pressure of the finger, there is provision for the depressing of the key to mechanically cause the depressing of the push 22 of the switch 20, which in practice implies that a rigid link is necessary between the key and the push 22.

The key 30 is inserted into a housing 42 of appropriate shape of a casing 40 of the keyboard. The key can be depressed freely into this housing but cannot come out of it, for example by virtue of ledges 44 of the casing overhanging the lateral edges of the key. If the keyboard needs to be leaktight, a tight seal 46 can be provided between the key 30 and the casing 40. The rigid printed circuit 10 is fixed to the casing by means (not represented) situated for example at the periphery of the keyboard. The pace between the casing and the printed circuit is sufficient to accommodate the height of the components of the printed circuit, in particular the switches 20.

A flexible printed circuit 50 is fixed to the casing 40 of the keyboard and is interposed between the printed circuit and the keys. This flexible printed circuit carries a light-emitting diode 60 situated above the switch component 20 and underneath the center of the key 30. It also carries supply conductors for the diode, and possibly other circuit elements. The emission of light underneath the center of the key makes it possible to illuminate the latter from the rear.

The flexible printed circuit 50 comprises flexible parts 52 and rigid parts 54. The greater local rigidity is conferred for example by a greater local thickness of the flexible film which constitutes the printed circuit 50, or else by one or more rigid plates glued onto the flexible film at the sites where one wishes to make it rigid. A rigid part 54 is situated underneath each key and on a surface such that the depressing of the key causes the underside of the key to bear against the rigid part 54 and so that this rigid part 54 transmits the pressure from the key to the push button 22 of the switch component 20. The flexible parts 52 make it possible to afford a sufficient displacement of the rigid parts 54 during this depression as to actuate the switch 20.

Preferably, the light-emitting diode 60 is soldered to the upper part of the rigid part 54 and is housed in a cavity 32 made at the center of the transparent key on the latter's rear side; this cavity is open on the underside. The key comes into contact, at the periphery of this cavity 32, directly with the rigid part 54 and it is therefore the peripheral edge 34 of the key which transmits the pressure to the rigid part 54 of the flexible circuit 50 without bearing on the light-emitting diode 60.

The flexible printed circuit is fixed to the casing for example by screws, or by gluing. It can also be fixed locally to the keys 30, via their lower surface, at the periphery 34 of the cavity 32. In this case, a flexible film part must extend between a point of fixing on the key and a point of fixing on the casing. The points of fixing on the key can be contrived in the flexible part or in the rigid part of the flexible printed circuit.

To improve the luminous efficiency of the device for illuminating the key, there is preferably provision for the cavity 32 which surrounds the light-emitting diode to have a height (above the diode) which is relatively big (for example two or three times the height of the diode), and for the lateral interior walls of the cavity to be fairly strongly reflecting. This makes it possible to avoid dispersion of the light towards the sides of the key and to maximize the proportion of light which ultimately leaves at the top of the key.

For example, an opaque, white colored lateral brace 36 can surround the diode over the entire height of the cavity 32.

In the bottom of the cavity 32, above the diode, a luminous film 38 can be arranged. This is for example a colored filter if the light-emitting diode emits white light whereas the key is desired to emit red or green light, etc. This filter can also be a filter which eliminates the infrared emissions, or any other filter according to the requirements of the user.

The printed conductors of the flexible printed circuit 50 must be linked to a power supply source so as to operate the diodes. A connector is preferably provided so as to ensure the transmission of this power. This connector can be linked directly to a complementary connector of the rigid printed circuit 10, in particular if the power source emanates from the printed circuit 10. The two connectors can then be situated the one directly above the other (plugged together preferably perpendicular to the plane of the two printed circuits). The flexibility of the flexible printed circuit can also be harnessed in order to bend one end of this circuit and fold it down towards the rigid printed circuit or towards another part of the keyboard or of the apparatus controlled via this keyboard.

Figure 2:
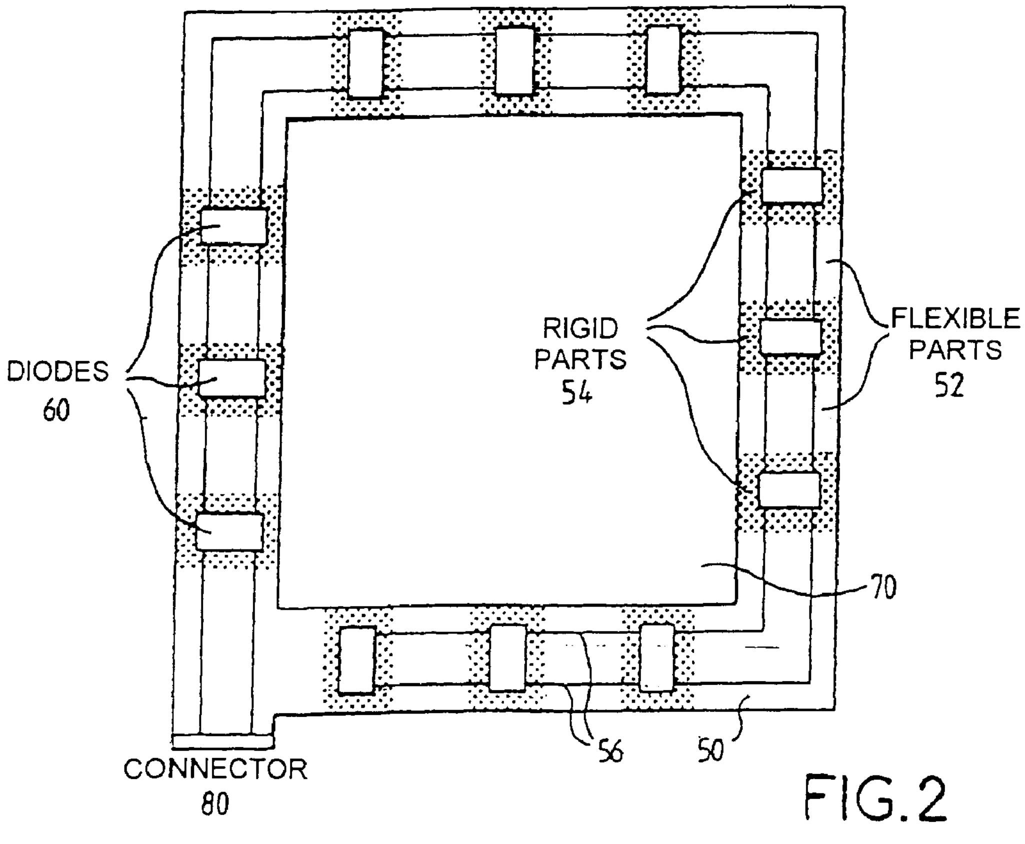
FIG. 2 represents a plan view of the whole of the flexible printed circuit in a keyboard application with twelve function keys arranged at the periphery of a square zone in which a display screen will be situated.

FIG. 2 represents a plan view of the flexible printed circuit, with its rigid parts 54 indicated in the form of dots (zones of greater thickness of the flexible printed circuit) and the light-emitting diodes 60 soldered on each rigid part.

In this example, the keyboard has the shape of a narrow band surrounding the periphery of a rectangle or a square 70 reserved for a display screen. The flexible printed circuit 50 then has the shape of this narrow band as may be seen in FIG. 2. The keys (not represented) of the keyboard are distributed regularly along this band, with the same distribution as the diodes 60 since a diode is placed just underneath each key. Conductors 56 are etched onto the flexible printed circuit and convey current to all the diodes from a connector 80 formed preferably on an edge of the flexible circuit. In the simplest embodiment, there are two conductors which run along the entire narrow band and which in parallel supply all the diodes, but it will be understood that a different circuitry may be provided if more complex illumination functions are desired.

The connector 80 can be plugged in vertically (plugged in with a movement in a direction perpendicular to the plane of the flexible printed circuit 50 and of the rigid printed circuit 10), with a corresponding connector fixed on the rigid printed circuit 10, the flexibility of the flexible circuit enabling the connectors to be brought together and plugged in.

The connectors can also be plugged in horizontally.

Finally, it is possible to make provision for the flexible printed circuit to be bent back on itself at its end so as to make plugging-in easier. The connector 80 can then be placed at the end of an extension of band removed sufficiently far from the rectangle on which the diodes are arranged.

The keyboard can in all cases have a shape other than a band running around a square or a rectangle. It can itself be rectangular with keys distributed over almost the entire surface of the rectangle. The flexible printed circuit then has a corresponding rectangular shape with rigid areas and light-emitting diodes distributed like the keys over the entire rectangular surface.

What is claimed is:

1. An electronic keyboard comprising a rigid printed circuit on which is soldered at least one switch which can be actuated indirectly by a finger of a user, an at least partly transparent key surmounting the switch and a means of illumination for illuminating the key from underneath the key, light rays emanating from the means of illuminating being visible to the user via the transparent part of the key, wherein the keyboard furthermore comprises a flexible printed circuit interposed between the key and the rigid printed circuit carrying the switch, in that the flexible printed circuit comprises a rigid part situated between the key and the switch, in that the means of illuminating comprises a light-emitting diode soldered on the rigid part between the key and the switch and in that the key comprises a cavity surrounded by a peripheral edge, the diode being housed in the cavity and the peripheral edge coming to bear on the rigid part around the diode.

2. The keyboard as claimed in claim 1, wherein internally the cavity comprises opaque vertical walls.

3. The keyboard as claimed in claim 2, wherein the vertical walls of the cavity are reflecting.

4. The keyboard as claimed in claim 1, wherein the bottom of the cavity forms the transparent part of the key and comprises a filter for eliminating components of the light emitted by the diode.

5. The keyboard as claimed in claim 1, wherein the switch comprises a push button, the rigid part of the flexible printed circuit coming into contact with the push button.

6. The keyboard as claimed in claim 1, wherein a flexible printed circuit is fixed by gluing or screwing to a casing of the keyboard, the casing comprising a housing for the key.

7. The keyboard as claimed in claim 6, wherein the flexible printed circuit is also fixed by gluing or screwing to a lower part of the key.

* * * * *